United States Patent [19]
Moon et al.

[11] Patent Number: 5,985,735
[45] Date of Patent: Nov. 16, 1999

[54] TRENCH ISOLATION PROCESS USING NITROGEN PRECONDITIONING TO REDUCE CRYSTAL DEFECTS

[75] Inventors: Peter K. Moon, Portland; David T. Krick; Kerry L. Spurgin, both of Hillsboro, all of Oreg.

[73] Assignee: Intel Corporation, Santa Clara, Calif.

[21] Appl. No.: 08/536,470

[22] Filed: Sep. 29, 1995

[51] Int. Cl.$^6$ .................................................. H01L 21/76
[52] U.S. Cl. .................. 438/435; 438/437; 438/424; 438/788; 148/DIG. 50
[58] Field of Search .................................. 438/424, 435, 438/296, 221, FOR 227, 788, 437; 148/DIG. 50

[56] References Cited

U.S. PATENT DOCUMENTS

| | | |
|---|---|---|
| 5,316,965 | 5/1994 | Philipossian et al. ................. 438/424 |
| 5,447,884 | 9/1995 | Fahey et al. ............................. 438/437 |
| 5,492,858 | 2/1996 | Bose et al. .............................. 438/437 |
| 5,643,823 | 7/1997 | Ho et al. ........................... 148/DIG. 50 |

*Primary Examiner*—Trung Dang
*Attorney, Agent, or Firm*—Blakely, Sokoloff, Taylor & Zafman

[57] ABSTRACT

A method of forming a trench isolation structure in a semiconductor substrate. After etching a trench into the semiconductor substrate, an oxide layer is formed within the trench. The surface of this oxide layer is subjected to a nitrogen plasma. Subsequently, another oxide layer is deposited over the nitrogen-rich surface of the first oxide layer. Deposition of this second oxide layer is accomplished by a chemical vapor deposition (CVD) process primarily using a reactant gas other than ozone.

15 Claims, 2 Drawing Sheets

TRENCH ISOLATION PROCESS USING NITROGEN PRECONDITIONING TO REDUCE CRYSTAL DEFECTS

FIELD OF THE INVENTION

The present invention relates to semiconductor processing and more particularly to a trench isolation process which reduces crystal defects.

BACKGROUND OF THE INVENTION

As the demand for cheaper, faster, lower power consuming microprocessors increases, so must the device packing density of the integrated circuit (IC). Very Large Scale Integration (VLSI) techniques have continually evolved to meet the increasing demand. All aspects of the IC must be scaled down to fully minimize the dimensions of the circuit. In addition to minimizing transistor dimensions, one must minimize the dimensions of the field regions (or isolation regions) which serve to physically and electrically isolate one semiconductor device from an adjacent semiconductor device on a semiconductor substrate so that each device can operate independently of the other.

In general, the number of transistors which can be built on a silicon substrate is limited only by the size of the transistors and the available surface area of the silicon substrate. Transistors can only be built in active regions of a silicon substrate while isolation regions of the substrate are dedicated to separating active regions from one another. Therefore, to maximize the number of transistors on the surface of a silicon substrate, it is necessary to maximize the available active surface area of the substrate. The active surface area is maximized by, in turn, minimizing the isolation regions of the silicon substrate. In order to fully minimize an isolation region, the width of the isolation region should approach the minimum width printable by a given photolithographic technology.

One technology which has been developed to form such isolation regions is known as trench technology. A trench isolation structure is formed in a silicon substrate by etching a trench region into the substrate and subsequently refilling this trench with some type of trench fill material. Thereafter active regions adjacent to the trench isolation structure are available for conventional semiconductor processing to form transistors on the semiconductor device.

The material used to fill the trench formed in the semiconductor substrate plays an important roll in the robustness and isolation quality of the trench isolation structure. Typically the trench is filled with a dielectric material such as, for example, a silicon dioxide (oxide). One method of forming an oxide within a trench is by thermal chemical vapor deposition (ThCVD) using ozone.

A ThCVD process is a process by which thermal energy is used to excite reactant gasses in a deposition chamber to form a desired film to be deposited on the surface of a substrate. Because of its highly reactive nature, practitioners have used ozone ($O_3$) as one of the reactants in a ThCVD process to provide the oxygen necessary to form the oxide film at low temperatures within the range of approximately 300° C. to 500° C. It has been found that the quality of ThCVD oxide films formed using ozone as a reactant gas is highly dependent on the nature of the underlying substrate upon which the oxide is deposited.

For example, it has been found that a high quality ThCVD oxide layer formed using ozone requires nitrogen preconditioning of an underlying oxide film before depositing the ThCVD oxide layer using ozone. During nitrogen preconditioning, an oxide film is subjected to a nitrogen plasma. This nitrogen plasma transforms the top few monolayers of oxide into a nitrogen-rich oxide surface. In doing so, the quality of the surface of this first oxide layer is modified so as to improve the ability of the subsequently deposited oxide layer to stick to the surface of the first oxide layer. As a result, the quality of the ThCVD oxide layer formed using ozone as a source gas is vastly improved.

Unfortunately, ThCVD films exhibit poor across wafer and wafer to wafer film thickness uniformity. Such non-uniformity causes manufacturing problems including, for example, problems associated with chemical mechanical polishing (CMP) of these wafers. Unless the film to be polished by a CMP process is uniform, the danger exists that the CMP process will entirely etch through the film, causing damage to underlying structures. Therefore, the non-uniformity of ThCVD films makes these wafers susceptible to damage by CMP.

One solution to the non-uniformity problem exhibited by ThCVD films is to employ a plasma enhanced chemical vapor deposition (PECVD) process to deposit an oxide layer in the trench. In a PECVD process, electromagnetic energy (RF energy) is used to excite the reactant gases in a deposition chamber to form the desired material deposited on the surface of the substrate. PECVD oxide layers are formed using oxygen ($O_2$) as one of the reactant gases to provide the oxygen necessary to form the oxide layer. It is well known in the field that the film quality of PECVD oxide layers is not dependent on the nature of the underlying substrate upon which the PECVD oxide is deposited. The plasma energy in a PECVD system more than adequately ensures that the species to be deposited on a substrate are energetic enough to be adsorbed on the surface of the underlying layer with a high sticking coefficient. Consequently, it is well known that preconditioning of the underlying layer upon which a PECVD oxide will be deposited is neither required nor desired.

Low pressure CVD (LPCVD) layers are formed using tetraethylorthosilicate (TEOS) alone or in addition to oxygen ($O_2$) as a reactant gas to form the oxide layer. However, instead of RF energy to excite the source gases, LPCVD processes typically employ thermal energy by way of high temperatures in the deposition chamber. Because ozone is not used as the reactant gas in a LPCVD process, it is well known that, as with PECVD oxide layers, preconditioning of the underlying layer upon which a LPCVD oxide will be deposited is neither required nor desired.

It has been found in certain processing environments that semiconductor substrates containing trenches filled with oxide films are prone to crystal defects. One such defect is known as a dislocation. A dislocation in a silicon crystal structure can significantly degrade the performance of the semiconductor device by for example, increasing p-n junction leakage and reducing the breakdown voltage. These problems can lead to poor yield and reliability of semiconductor devices.

What is desired is a trench isolation structure which reduces the occurrence of crystal defects yet provides good film thickness uniformity.

SUMMARY OF THE INVENTION

A method of forming a trench isolation structure in a semiconductor substrate is described. After etching a trench into the semiconductor substrate, an oxide layer is formed within the trench. The surface of this oxide layer is subjected to a nitrogen plasma. Subsequently, another oxide layer is deposited over the nitrogen-rich surface of the first oxide layer. Deposition of this second oxide layer is accomplished by a chemical vapor deposition (CVD) process primarily using a reactant gas other than ozone.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method of forming a trench isolation structure in a semiconductor substrate which overcomes the deficiencies of the prior art is described below. In general, in accordance with the present invention, a trench is first etched into a semiconductor substrate. Next the exposed surfaces of the semiconductor material within the trench are exposed to an oxidizing ambient to form a thermal oxide layer lining the trench. Next this thermal oxide layer is subjected to a nitrogen plasma to form a nitrogen-rich surface on the thermal oxide layer. After the nitrogen-rich surface has been formed, the remainder of the trench is filled with a substantially undoped oxide layer deposited using a plasma enhanced chemical vapor deposition (PECVD) process.

After the trench has been filled in this manner, a chemical mechanical polishing technique is used to etch back the PECVD oxide layer. This etch-back step effectively isolates the thermal and PECVD oxide layers within the trench region. After the surface has been etched back, the active regions of the semiconductor substrate are then available for creating active devices, such as transistors, using conventional semiconductor processing techniques.

A trench isolation process and structure will be described in more detail below.

Figure 1:
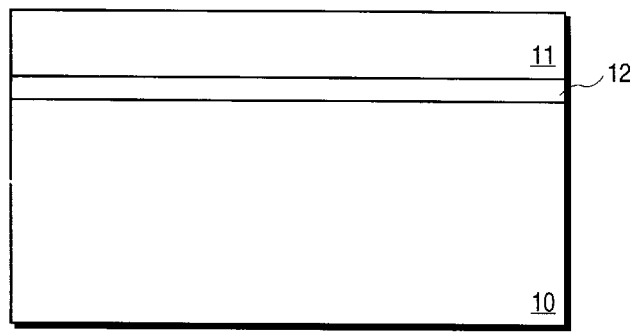
FIG. 1 is a cross-section of a semiconductor substrate.

FIG. 1 shows a semiconductor substrate 10 upon which a pad oxide layer 12 and a silicon nitride (nitride) layer 11 have been formed. Nitride layer 11 serves to inhibit oxidation of the underlying semiconductor substrate 10 by preventing oxygen from reaching the underlying substrate during a subsequent high temperature oxidation step. Pad oxide layer 12 is used to cushion the transition of stresses between the underlying semiconductor substrate 10 and nitride layer 11. For another embodiment, the nitride layer, pad oxide layer, or both may be eliminated or replaced by other masking layers or multi-layers such as, for example, polysilicon. Alternatively, other masking materials may be used in addition to the pad oxide and nitride layers. A masking layer may serve as an etch stop or end point detection for a subsequent planarization etch back process to be described below. A masking layer additionally serves to protect the underlying semiconductor substrate from damage or contamination. Therefore, any masking layer which aids in the planarization etch-back process or in protecting the underlying semiconductor substrate from contamination may be found suitable for use as a masking layer. Additionally, while one embodiment of the present invention uses silicon as its semiconductor substrate, the substrate of other embodiments may comprise other materials or layers. For example, a semiconductor substrate may include an oxide layer in the case of silicon on insulator (SOI) processes or a sapphire layer in the case of silicon on sapphire (SOS) processes.

Figure 2:
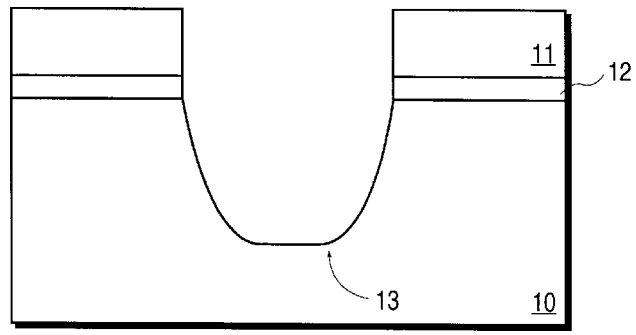
FIG. 2 is the cross-section of FIG. 1 after a trench has been etched.

FIG. 2 shows the cross section of FIG. 1 after trench 13 has been etched into the substrate. Standard photolithographic techniques are used to define the location and width of the trench. An anisotropic etch technique is used to etch through nitride layer 11 and pad oxide layer 12. Then a timed etch is using to etch trench 13 into semiconductor substrate 10 using an etch technique which creates the moderately sloped sidewalls of trench 13 as shown in FIG. 2. In addition to alleviating the stress caused by formation of the thermal oxide layer, described below, the sloped sidewalls of trench 13 may also help capture well implant dopants, resulting in improved performance of adjacent transistors. The width of trench 13 is approximately 0.5 microns. The depth of trench 13 into semiconductor substrate 10 is also approximately 0.5 microns.

For an alternate embodiment of the present invention, etch techniques such as, for example, reactive ion etch, plasma sputter etch, or ion milling may be used in conjunction with conventional photolithographic techniques to form a trench in a semiconductor substrate. While the depth of the trench may be determined by the duration of a timed etch for one embodiment, a layer of etch stop material is formed at the bottom of the trench to halt the etch process for another embodiment. Also, for an alternate embodiment, a trench is formed by selectively growing or depositing substrate material about the trench to form the walls of the trench from the bottom up. In addition, in accordance with an embodiment of the present invention in which advanced ultra large scale integration (ULSI) techniques are used, the trench width may be as narrow as approximately 0.1 microns or less. The actual width and depth of the trench primarily depends on the technology used and the particular isolation function performed by the trench isolation structure.

As a result, the actual dimensions of a trench formed in accordance with the present invention may vary substantially. For example, the width of a trench isolation structure used to separate active devices disposed within the same well of a semiconductor substrate will generally approach the minimum dimension which can be printed by the photolithographic technique used. On the other hand, where the trench isolation structure is used to separate adjacent wells from one another, the width of the trench isolation structure may be two or three times the minimum dimension printable by the photolithographic technique used. The dimensions of the trench should be as small as possible in order to maximize the available active area of the semiconductor substrate while still being wide and deep enough to maintain the necessary electrical isolation of the active devices formed within the substrate.

Figure 3:
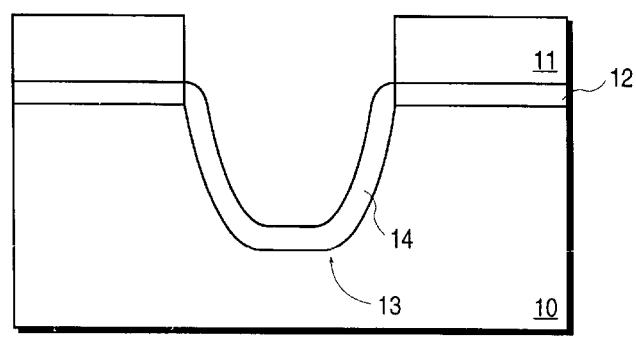
FIG. 3 is the cross-section of FIG. 2 after an oxide layer has been formed within the trench.

FIG. 3 shows the substrate of FIG. 2 after thermal oxide layer 14 has been grown within trench 13. Thermal oxide layer 14 provides a clean, high quality oxide lining between semiconductor substrate 10 and the subsequently deposited oxide layer used to fill the remainder of trench 13, described in more detail below. Thermal oxide layer 14 is formed by subjecting the exposed semiconductor substrate surfaces within trench 13 to an oxidizing ambient under high temperature conditions to grow approximately 500 Å of thermal oxide.

The growth of thermal oxide layer 14 tends to put stress on semiconductor substrate 10 near the bottom of trench 13. This is because as thermal oxide layer 14 grows out from the bottom of trench 13, the oxide pushes against the bottom and sidewalls of trench 13 thereby causing stress in the semiconductor substrate regions adjacent to trench 13. This stress can cause dislocations in semiconductor substrate 10 leading to significant reliability problems including junction leakage and low breakdown voltages. The walls of trench 13 have been sloped to alleviate a large proportion of the stress induced by the growth of thermal oxide layer 14. For one embodiment of the present invention, the thickness of the thermal oxide layer is within the range of approximately 100 to 800 Å. In general, the thickness of the thermal oxide layer is determined by taking into account the competing interest of adequately lining the trench with a high quality oxide layer verses minimizing the thermal oxide induced stresses in regions of the semiconductor substrate adjacent to the trench.

For an alternate embodiment of the present invention, the layer to line the surfaces of the trench is formed by a chemical vapor deposition (CVD) process. In such an embodiment, the CVD liner serves to protect the underlying semiconductor substrate from contamination by, for example, preventing diffusion of dopant material from a subsequently deposited layer from reaching the semiconductor substrate. Consequently, a substantially undoped CVD oxide layer may be found to exhibit suitable trench lining properties. In addition, a trench liner formed by a CVD process may additionally serve as an etch stop or end point detection layer for a subsequent planarization etch back process, described in more detail below.

In accordance with another embodiment of the present invention, a doped dielectric film formed by a CVD process is used to form the layer lining the trench. In this embodiment the doped dielectric layer is used as a diffusion source for dopants used to dope the semiconductor substrate regions adjacent to the trench. These doped semiconductor substrate regions serve to improve the isolation properties of the trench isolation structure. Similarly, for another embodiment, the semiconductor substrate regions adjacent to the trench are doped by direct implantation of impurities into the trench. In this embodiment, sloped sidewalls such as those of trench 13 shown in FIG. 3 aid in capturing the implanted dopant species.

Figure 4:
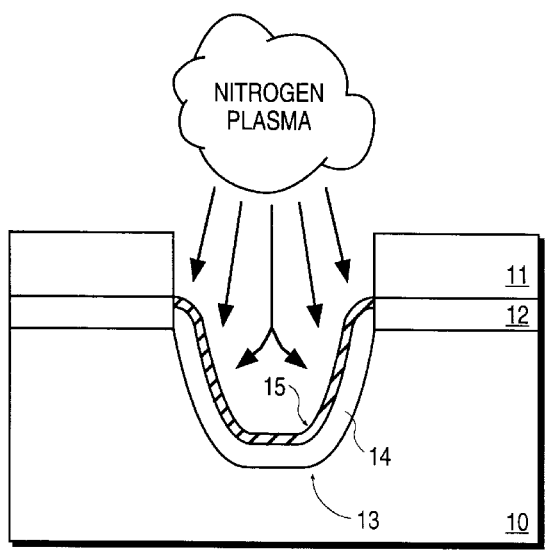
FIG. 4 is the cross-section of FIG. 3 after the layer has been treated in accordance with the present invention.

FIG. 4 shows the substrate of FIG. 3 while the substrate is being subjected to a nitrogen plasma. By subjecting the substrate to a nitrogen plasma the surface of thermal oxide layer 14 is transformed into a nitrogen-rich surface 15. The nitrogen plasma has the effect of exciting nitrogen ions with enough energy to cause the nitrogen to embed itself into the surface of thermal oxide layer 14. For one embodiment, the RF power density in the plasma reactor in which the substrate resides during this process step is approximately 2 watts/cm$^2$ with an RF frequency of 13.56 MHz. The nitrogen flow rate is approximately 3000 sccm and the temperature is approximately 400° C. at a pressure of approximately 5 torr. The substrate of FIG. 4 is subjected to these plasma conditions for approximately 5 minutes to create a sufficiently nitrogen-rich oxide surface 15 on thermal oxide layer 14.

For an alternate embodiment, the RF power density in the plasma reactor is in the range of approximately 0.5 to 5 watts/cm$^2$. The nitrogen flow rate is in the range of approximately 500 to 5000 sccm and the temperature is in the range of approximately 300° C. to 500° C. at a pressure in the range of approximately 2 to 20 torr. The substrate is subjected to these plasma conditions for an amount of time in the range of approximately 1 to 20 minutes to create a sufficiently nitrogen-rich oxide surface on an oxide layer. For another embodiment, a lower frequency RF source may be used in conjunction with the 13.56 MHz source to more quickly form the nitrogen-rich oxide surface. Note that these process conditions are similar to those normally used to precondition an oxide layer for subsequent deposition of a CVD oxide layer formed using ozone as a reactant gas. However, in accordance with the present invention, ozone is not used as a reactant gas during the formation of a subsequently deposited CVD oxide layer.

It is only a very thin surface of thermal oxide layer 14 that is affected by the nitrogen plasma treatment. This thin, nitrogen-rich oxide surface 15 of thermal oxide layer 14 may only be on the order of one monolayer thick. A monolayer is the thickness of a sub-layer of thermal oxide layer 14 comprising only the silicon dioxide molecules residing along the upper surface of the layer. As such, the thickness of the nitrogen-rich surface 15 of thermal oxide layer 14 is in the range of approximately 5 to 10 angstroms. Alternatively, the nitrogen-rich oxide surface 15 is on the order of two to four monolayers thick, in the range of approximately 10 to 20 angstroms.

By transforming the surface of thermal oxide layer 14 into nitrogen-rich surface 15, it has been found that the occurrence of dislocations within the regions of semiconductor substrate 10 adjacent to trench 13 is significantly reduced. Currently it is not fully understood why the formation of nitrogen-rich surface 15 suppresses the formation of crystal defects in the semiconductor substrate. One theory is that the nitrogen-rich surface 15 converts all or some portion of the underlying thermal oxide layer 14 into an oxynitride during subsequent thermal processing steps. Another theory is that nitrogen-rich surface 15 on thermal oxide layer 14 acts as a barrier layer preventing dislocation forming impurities from diffusing out of a subsequently deposited CVD layer and into semiconductor substrate 10.

Yet another theory is that nitrogen preconditioning may form a damaged or defect-rich region in conjunction with final trench formation processing near the edges of the active regions. These defect-rich regions then act as a sink for the defects generated during the formation of transistor source/drain junction regions. Without this sink for defects generated during junction formation, the defects are precipitated in the active device region. But whatever the case, it has been discovered that by subjecting thermal oxide layer 14 to a nitrogen plasma at this step in the formation of the trench isolation structure, the occurrence of dislocations within semiconductor substrate 10 adjacent to trench 13 is vastly reduced.

Figure 5:
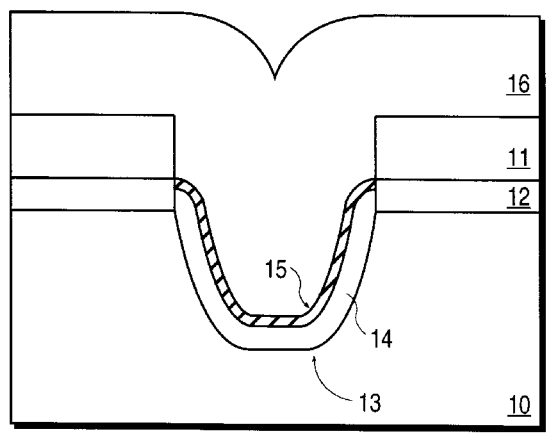
FIG. 5 is the cross-section of FIG. 4 after another layer has been formed.

FIG. 5 shows a cross-section of the substrate of FIG. 4 after a substantially undoped CVD oxide layer 16 has been deposited. In accordance with the embodiment shown in FIG. 5, CVD oxide layer 16 is formed by a PECVD process to a thickness of approximately 0.5 microns. PECVD oxide layer 16 is formed using two PECVD deposition steps, with a sputter etch in-between, to get good gap fill. The reactant gasses used to form CVD layer 16 include tetraethylorthosilicate (TEOS) and oxygen ($O_2$). Note that in accordance with the present invention ozone ($O_3$) is not used as a reactant or source gas in the formation of CVD oxide layer 16.

For one embodiment of the present invention, the thickness of CVD oxide layer 16 is highly dependent on the dimensions of the trench to be filled. In addition, the thickness of the CVD oxide layer should be chosen to provide adequate planarization and process control during the subsequent planarization etch back step. For another embodiment of the present invention, the CVD oxide layer may be formed by processes other than PECVD such as, for example, thermal CVD (ThCVD) or low pressure CVD (LPCVD), and may be formed using reactant species other than or in addition to TEOS and oxygen. For example, the CVD oxide layer may comprise a dopant to form phosphosilicate glass (PSG), borosilicate glass (BSG), or borophosphosilicate glass (BPSG). For another embodiment the material used to fill a trench formed in accordance with present invention may not be an oxide material but rather, for example, a silicon nitride or polysilicon film.

One important aspect to consider when selecting the material used to fill the trench is that the material selected should be different than the underlying material used to mask the surface of the semiconductor substrate. For example, for an embodiment of the present invention in which a nitride layer is used to mask the surface of the semiconductor substrate, as shown in FIG. 5, the material used to fill the trench is preferably not a nitride. In this manner, processes and chemistries may be implemented during the subsequent planarization etch back process described below to ensure that the etch back of the trench filled material stops on the underlying masking layer. Note that for other embodiments of the present invention, the single CVD oxide layer used to fill the trench may be replaced by a multi-layer stack of trench materials suitable for the particular application in which they are employed.

For one embodiment of the present invention, CVD oxide layer 16 of FIG. 5 after being deposited, is annealed at 1000° C. in a non oxidizing ambient such as, for example, argon or nitrogen. The purpose of this anneal step is to densify CVD oxide layer 16, thereby providing a higher quality dielectric material within trench 13. In addition, densification of CVD oxide layer 16 results in a more uniform oxide density which improves etch rate uniformity during subsequent etch steps.

Figure 6:
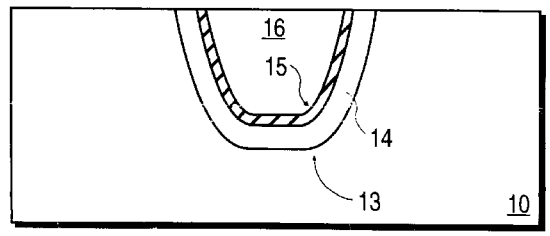
FIG. 6 is the cross-section of FIG. 5 after the surface of the substrate has been etched back.

FIG. 6 shows a cross-section of the substrate of FIG. 5 after a planarization etch back process. The planarization etch back process comprises the use of chemical mechanical polishing to polish CVD oxide layer 16 down to nitride layer 11. Then more conventional chemical etching techniques are used to further etch back nitride layer 11 and pad oxide layer 12 down to the upper surface of semiconductor substrate 10. In doing so, thermal oxide layer 14, along with its nitrogen-rich surface 15, and CVD oxide layer 16 become isolated within trench 13. For an alternate embodiment, an alternate etch process or combination of processes, such as wet chemical etch, reactive ion etch, back sputter, ion mill, chemical mechanical polishing, or mechanical polishing, are used to remove all or a portion of the materials which reside substantially outside trench 13. For example, for an alternate embodiment of the present invention BPSG is the material used to fill the trench. This BPSG layer may be subsequently reflowed to planarize its surface, then etched back using a dry etch process. In such an embodiment, disappearance of the characteristic peaks of boron and phosphorus from the by-product of the etch can be used as an end point detection. Subsequently the underlying nitride and pad oxide layers are etched using etchant chemistries appropriate to those layers.

At this point the active regions at the surface of semiconductor substrate 10, adjacent to trench 13, are ready for subsequent processing to form transistors in accordance with well known very large scale integration (VLSI) techniques. For example, the next process step concerns the formation of a gate oxide layer on the surface of semiconductor substrate 10. Note that the trench isolation structure shown in FIG. 6 will provide adequate electrical isolation between transistors formed adjacent to the structure. In addition, the trench isolation structure shown in FIG. 6 does not contain any voids and aids in the suppression of dislocations within semiconductor substrate 10. As a result, the yield, quality, and reliability of a device incorporating trench isolation structures formed in accordance with the present invention are improved.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of forming an isolation structure in a semiconductor substrate comprising the steps of:

a) etching a trench in the semiconductor substrate;

b) forming a first oxide layer within the trench;

c) subjecting a surface of the first oxide layer to a nitrogen plasma; and d) depositing a second oxide layer on the surface of the first oxide layer, the second oxide layer being deposited by a chemical vapor deposition (CVD) process primarily using a reactant gas other than ozone.

2. The method of claim 1 further comprising the step of performing a chemical mechanical polishing etch-back step to isolate the first and second oxide layers within the trench.

3. The method of claim 1 wherein the first oxide layer is formed by a method including growing a thermal oxide within the trench.

4. The method of claim 1 wherein the second oxide layer is deposited by a plasma-enhanced CVD (PECVD) process.

5. The method of claim 4 wherein the second oxide layer is a substantially undoped oxide layer.

6. The method of claim 1 wherein the second oxide layer is a doped oxide selected from a group consisting of borosilicate glass (BSG), phosphosilicate glass (PSG), borophosphosilicate glass (BPSG), and any combination thereof.

7. The method of claim 4 wherein the PECVD process is performed using a TEOS chemistry.

8. The method of claim 1 wherein the second oxide layer is deposited by a low pressure CVD (LPCVD) process.

9. The method of claim 3 wherein the nitrogen plasma creates a nitrogen-rich surface of the first oxide layer that is approximately one monolayer thick.

10. A method of forming an isolation structure in a semiconductor substrate comprising the steps of:

a) etching a trench in the semiconductor substrate;

b) growing a thermal oxide within the trench to form a first oxide layer;

c) subjecting the first oxide layer to a nitrogen plasma to form a nitrogen-rich surface on the first oxide layer;

d) depositing a second oxide layer over the nitrogen-rich surface of the first oxide layer, the second oxide layer being deposited by a chemical vapor deposition (CVD) process in the absence of ozone; and e) performing a chemical mechanical polishing etch-back step to isolate the first and second oxide layers within the trench.

11. The method of claim 10 wherein the nitrogen-rich surface of the first oxide layer is approximately one monolayer thick.

12. The method of claim 10 wherein the second oxide layer is a substantially undoped oxide layer.

13. The method of claim 10 wherein the second oxide layer is a doped oxide selected from a group consisting of borosilicate glass (BSG), phosphosilicate glass (PSG), borophosphosilicate glass (BPSG), and any combination thereof.

14. The method of claim 10 wherein the CVD process is a plasma-enhanced CVD (PECVD) process performed using a TEOS chemistry.

15. The method of claim 10 wherein the CVD process is a low pressure CVD (LPCVD) process performed using a TEOS chemistry.

* * * * *

UNITED STATES PATENT AND TRADEMARK OFFICE
CERTIFICATE OF CORRECTION

PATENT NO. : 5,985,735
DATED : November 16, 1999
INVENTOR(S) : Moon et al.

It is certified that error appears in the above-identified patent and that said Letters Patent is hereby corrected as shown below:

Column 5,
Line 26, before "to line", insert -- used --.

Signed and Sealed this

Twenty-fourth Day of June, 2003

JAMES E. ROGAN
*Director of the United States Patent and Trademark Office*